(12) United States Patent
Diwu et al.

(10) Patent No.: US 12,020,744 B2
(45) Date of Patent: Jun. 25, 2024

(54) METHOD AND DEVICE FOR TESTING MEMORY AND METHOD FOR SIMULATED TESTING

(71) Applicant: CHANGXIN MEMORY TECHNOLOGIES, INC., Hefei (CN)

(72) Inventors: Tianhao Diwu, Hefei (CN); Xikun Chu, Hefei (CN); Dong Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 193 days.

(21) Appl. No.: 17/808,297

(22) Filed: Jun. 22, 2022

(65) Prior Publication Data
US 2023/0230629 A1   Jul. 20, 2023

Related U.S. Application Data

(63) Continuation of application No. PCT/CN2022/080687, filed on Mar. 14, 2022.

(30) Foreign Application Priority Data

Jan. 17, 2022 (CN) .......................... 202210048891.2

(51) Int. Cl.
*G11C 11/4091* (2006.01)
*G11C 11/4074* (2006.01)
*G11C 11/4094* (2006.01)
*G11C 11/4096* (2006.01)

(52) U.S. Cl.
CPC ...... *G11C 11/4091* (2013.01); *G11C 11/4074* (2013.01); *G11C 11/4094* (2013.01); *G11C 11/4096* (2013.01)

(58) Field of Classification Search
CPC ............ G11C 11/4091; G11C 11/4074; G11C 11/4094; G11C 11/4096
USPC ......................................................... 365/201
See application file for complete search history.

(56) References Cited

U.S. PATENT DOCUMENTS 6,735,726 B2 * 5/2004 Muranaka ........... G06F 11/1008
                                                   365/201

* cited by examiner

*Primary Examiner* — Huan Hoang
(74) *Attorney, Agent, or Firm* — Syncoda LLC; Feng Ma

(57) ABSTRACT

A method and device for testing a memory and a method for simulated testing include operations as follows. First data is written into a to-be-tested storage unit through a Sense Amplifier (SA), second data different from the first data is written into the storage unit through the SA, and an amplification duration of the SA is shortened during the writing the second data, and data stored in the storage unit is read, and whether the storage unit is abnormal is determined according to the read data.

20 Claims, 12 Drawing Sheets

METHOD AND DEVICE FOR TESTING MEMORY AND METHOD FOR SIMULATED TESTING

CROSS-REFERENCE TO RELATED APPLICATIONS

This is a continuation of International Patent Application No. PCT/CN2022/080687 filed on Mar. 14, 2022, which claims priority to Chinese Patent Application No. 202210048891.2 filed on Jan. 17, 2022. The disclosures of these applications are hereby incorporated by reference in their entirety.

BACKGROUND

In the memory development and manufacturing process, a large number of tests are performed on the memory to determine whether there is any abnormality in the manufacturing process. For example, short circuits, contact failure or the like in the manufacturing process causes electric leakage or read/write abnormalities. Due to the sophisticated and complex structure of memory products, a series of electrical tests are required to identify the abnormalities. However, some abnormalities cannot manifest readily in general read and write conditions, but affect the service life and product reliability. Therefore, some reliable testing methods are required to accurately identify abnormalities that cannot manifest readily.

SUMMARY

The embodiments of the disclosure relate to semiconductor manufacturing technologies, and relate to but are not limited to a method and device for testing a memory and a method for simulated testing.

A first aspect of the embodiments of the disclosure provides a method for testing a memory, which includes operations as follows.

First data is written into a to-be-tested storage unit through a Sense Amplifier (SA).

Second data is written into the storage unit through the SA. The second data is different from the first data, and an amplification duration of the SA is shortened during the writing the second data.

Data stored in the storage unit is read, and whether the storage unit is abnormal is determined according to the read data.

A second aspect of the embodiments of the disclosure further provides a device for testing a memory, including a writing circuit, a control circuit, and a reading circuit.

The writing circuit is configured to write data into a to-be-tested storage unit through an SA.

The control circuit is configured to control an amplification duration of the SA.

The reading circuit is configured to read data stored in the storage unit, and determine, according to the read data, whether the storage unit is abnormal.

A third aspect of the embodiments of the disclosure further provides a method for simulated testing, the method including operations as follows.

A process of writing first data into a to-be-tested storage unit is simulated by controlling the SA.

A process of writing second data different from the first data into the storage unit is simulated by controlling the SA, and an amplification duration of the SA is shortened by regulating a control signal of the SA during the writing the second data.

Data stored in the storage unit is read, and whether the storage unit is abnormal is determined according to the read data.

BRIEF DESCRIPTION OF THE DRAWINGS

The accompanying drawings are incorporated in the specification and constitute a part of the specification, and show embodiments conforming to the disclosure, and are used together with the specification to explain the principle of the disclosure.

Figure 1:
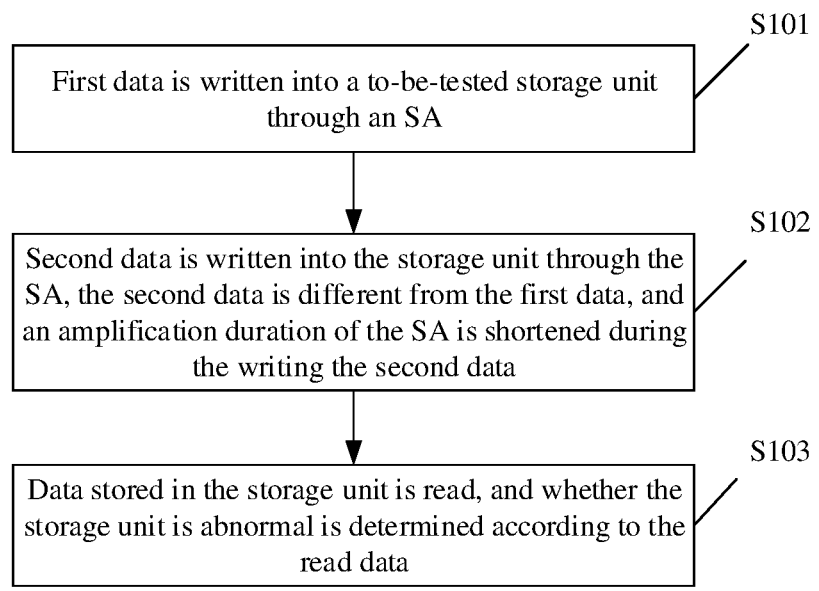
FIG. 1 is a first flowchart of a method for testing a memory according to an embodiment of the disclosure.

Specific embodiments of the disclosure are shown in the accompanying drawings above, and are further described in detail below. These accompanying drawings and text description are not used to limit the scope of the concept of the disclosure in any manner. Instead, the concept of the disclosure is described for a person skilled in the art with reference to specific embodiments.

DETAILED DESCRIPTION

The exemplary embodiments are described in detail herein, and the examples of the embodiments are represented in the accompanying drawings. In the following description regarding the accompanying drawings, unless otherwise indicated, the same reference numerals in different accompanying drawings represent the same or similar elements. The implementations described below in the exemplary embodiments do not represent all the implementations consistent with the disclosure. Instead, the implementations are only examples of the device and method consistent with some aspects of the disclosure and as exhaustively described in the appended claims.

Other embodiments of the disclosure will be easily conceived by those skilled in the art after taking the Description into consideration and practicing the solution disclosed herein. The disclosure is intended to cover any variations, uses, or adaptive changes of the disclosure. These variations, uses, or adaptive changes follow the general principles of the disclosure and include common general knowledge or conventional technical means in the art that are not disclosed herein. The Description and the embodiments are regarded as being exemplary only. The true scope and spirit of the disclosure are subject to the appended claims. The technical solutions of the disclosure are further described below in detail with reference to the accompanying drawings and the embodiments.

As shown in FIG. 1, the embodiments of the disclosure provide a method for testing a memory, including the following operations.

In S101, first data is written into a to-be-tested storage unit through an SA.

In S102, second data is written into the storage unit through the SA. The second data is different from the first data, and an amplification duration of the SA is shortened during the writing of the second data.

In S103, data stored in the storage unit is read, and whether the storage unit is abnormal is determined according to the read data.

The memory in the embodiments of the disclosure may be a semiconductor memory, and is a solid electronic device that is manufactured by using a semiconductor integrated circuit process and is configured to store data information. The memory may include a plurality of ranks. Each rank may further include a plurality of storage blocks. Each storage block is formed by a plurality of storage units arranged in an array. Each storage unit may be connected to a peripheral circuit by a word line and a bit line, and implement reading, writing, testing and other operation under control of a signal of the peripheral circuit.

A Dynamic Random Access Memory (DRAM) is taken as an example. Each storage unit is connected to a Bit Line (BL) and a complementary bit line (/BL). An SA is connected between the bit line and the complementary bit line by various control devices. When data needs to be read or written, a weak voltage difference between the bit line and the complementary bit line may be amplified by turning on an amplification function of the SA at an appropriate time point, to ensure that data in the storage unit is correctly read or an inputted signal is converted into charges to be correctly stored in the storage unit.

During testing a memory, predetermined first data may be written into the storage unit through the SA, and then the data is read to determine whether the storage unit is normal. However, a structure of a storage unit may have defects in a manufacturing process. For example, a contact structure connecting the storage unit with a bit line, that is, a Bit Line Contact (BLC), has excessively large resistance. In this case, however, charges can be charged into the storage unit when data is normally written, and the data can be correctly read. This case is not easily detectable, which results in subsequent abnormalities or reduced product reliability.

Therefore, in the embodiments of the disclosure, writing is performed two times. First data is written into a storage unit, and then second data different from the first data is written in the storage unit. An amplification duration of an SA is shortened during the writing of the second data.

The shortening the amplification duration of the SA is to deteriorate a testing condition of a writing process. If a storage unit has an abnormality, it is difficult to correctly write data within a relatively short amplification duration of the SA. Therefore, an abnormality that is not easily detectable originally can manifest by shortening the amplification duration of the SA.

A process of writing the first data may be used as a process of initializing a to-be-tested storage unit, so that charges are reset during the writing of the second data into the storage unit, to avoid that the deteriorated condition fails because the storage unit stores data same as the second data, thereby ensuring that the second data is written under the deteriorated condition, and further reducing a rate of missing detection.

It may be understood that the first data is written within an amplification duration of the SA for writing data during normal use of the memory or an amplification duration used in general testing. Alternatively, an extended amplification duration of the SA may be used, to write the first data into the storage unit as much as possible.

For example, the first data written into the storage unit is data "0", and data "1" is then written with a shortened amplification duration of the SA as a writing condition. If a storage unit has an abnormality, it is difficult to correctly write the data "1" within the shortened amplification duration of the SA. As a result, the data "0" can be read during data reading. In this way, the storage unit with an abnormality can be accurately recognized.

In some embodiments, the operation that the amplification duration of the SA is shortened during the writing of the second data includes operations as follows.

A bit line coupled to the storage unit is gated, to transfer a write voltage to be written to the bit line.

After the bit line is gated, an amplification function of the SA is turned on with a delay of a first predetermined duration. The second data is written into the storage unit based on the write voltage after the amplification function of the SA is turned on.

In the embodiments of the disclosure, the amplification duration of the SA can be shortened in a manner of turning on the amplification function of the SA with a delay during the writing of the second data.

The first duration may be set as a duration for which the turning on of the amplification function of the SA is delayed. Based on the amplification duration of normally writing data, the turning on of the amplification function of the SA is delayed for the first duration. In this way, if a storage unit has an abnormality, the second data that needs to be written fails to be stored in the storage unit. Therefore, correct second data fails to be read.

Correspondingly, if a storage unit has no abnormality, the second data can be correctly written within the shortened amplification duration, and it is determined that the storage unit is normal.

It needs to be noted that the first duration may be determined and set based on an empirical value obtained through experiments. Certainly, a relationship between the amplification duration of the SA and whether data can be normally written may be determined through calculation according to structural characteristics such as a product size of the memory, and the first duration for which the turning on is delayed may be determined according to a critical value under which data can be normally written or an amplification duration slightly greater than the critical value.

In some embodiments, the SA includes a power supply node. The operation that the amplification function of the SA is turned on with a delay of the first predetermined duration after the bit line is gated includes an operation as follows.

After the bit line is gated, a turn-on voltage is applied to the power supply node with a delay of the first duration to turn-on the SA.

The SA, as an active device, requires a voltage inputted from the power supply node to implement the function of signal amplification. In a usage process of the memory, the power supply node may be connected to an external constant-voltage power supply, to maintain a fast read/write function.

In the embodiments of the disclosure, in a testing process, the amplification duration of the SA may be controlled by adjusting a signal waveform of the power supply node.

For an implementation that the amplification function of the SA is turned on with a delay of the first predetermined duration, a voltage pulse delayed for the first duration may be applied to the power supply node as a turn-on voltage to turn on the amplification function of the SA. For example, a voltage of 0.5 V is applied within the first duration before the power supply node is turned on, and the voltage is switched to be 5 V as a turn-on voltage to allow the SA to perform signal amplification.

In some embodiments, the operation that the amplification duration of the SA is shortened during the writing of the second data includes operations as follow.

A bit line coupled to the storage unit is gated, to transfer a write voltage to be written to the bit line.

After the bit line is gated, an amplification function of the SA is turned off a second predetermined duration in advance. The second data is written into the storage unit based on the write voltage after the amplification function of the SA is turned on.

Similar to the delay method in the foregoing embodiments, in the foregoing embodiments of the disclosure, the amplification duration of the SA may be shortened in a manner of turning off the amplification function of the SA in advance, and the second data is written into a storage unit within a period of time during which the amplification function of the SA is in an on state.

The second duration may be the same as the first duration or may be different from the first duration.

In some embodiments, the SA includes a power supply node, and the operation that the amplification function of the SA is turned off the second predetermined duration in advance after the bit line is gated includes an operation as follows.

After the bit line is gated, a turn-off voltage is applied to the power supply node the second predetermined duration in advance, to turn off the amplification function of the SA.

The amplification duration of the SA may be controlled in a manner of regulating a signal waveform of the power supply node.

That is, a voltage signal applied to the power supply node is switched to a turn-off voltage the second duration in advance, to protect the SA from performing signal amplification. For example, a turn-on voltage such as 5V is applied within a period of time during which the amplification function of the SA is in the on state, and the turn-on voltage is switched to a turn-off voltage such as 0.5 V a second duration in advance. In this way, the amplification function of the SA is turned off, so that a duration for charging charges for writing the second data into a storage unit is shortened, to make an abnormality of the storage unit manifest.

It may be understood that in the testing process, a connection of the SA with the bit line can be kept normally, and the voltage of the power supply node is regulated through only an externally inputted pulse, to change the amplification capability of the SA. In this way, in one aspect, apart from the amplification duration of the SA, other parameters are consistent with those in a normal write process to avoid introducing other variables, thereby implementing accurate testing. In another aspect, the test process causes no damage to devices, thereby facilitating online testing.

In some embodiments, a first write duration for the writing of the first data is equal to a second write duration for the writing of the second data.

A first amplification duration of the SA for the writing of the first data is greater than a second amplification duration of the SA for the writing of the second data.

During the writing of data, a bit line is gated in response to a gate signal YS, and through a data input bus connected to the bit line, an externally inputted signal is used to transfer a voltage corresponding to data that needs to be written to the bit line. The duration for which the bit line is gated is a duration for writing data into the storage unit. Within the duration, charges on the bit line are transferred to a storage capacitor through a control switch of the storage unit, to implement data storage.

Correspondingly, in a process of writing data, when the amplification function of the SA is in an on state, to amplify a slight voltage difference between the bit line and the complementary bit line, thereby facilitating charging or discharging of the storage capacitor.

In the embodiments of the disclosure, a write duration of writing the first data may be the same as that of writing the second data, and an amplification duration in the process of writing the first data is different from that in the process of writing the second data. That is, the amplification duration of the SA during the writing of the second data is shorter than the amplification duration of the SA during the writing of the first data. In this way, in a testing process, a test objective can be implemented without regulating waveforms of other signals, thereby facilitating the setting and modification of test parameters.

In some embodiments, the operation that the bit line coupled to the storage unit is gated to transfer a write voltage to be written to the bit line includes an operation as follows.

The bit line coupled to the storage unit is gated within the second write duration, to transfer the write voltage to be written to the bit line. The second write duration is greater than the second amplification duration of the SA.

The second write duration is an amplification duration of the above gate signal YS of the bit line. The bit line is gated within the second duration, a write voltage to be written is transferred to the bit line, so that there is a voltage difference between the bit line and the complementary bit line.

When the amplification function of the SA is turned on, the voltage difference between the bit line and the complementary bit line is amplified, to charge or discharge the storage unit with the voltage on the bit line, thereby writing corresponding data.

In some embodiments, the memory includes at least one storage block, and the storage block includes a plurality of storage units; and the method further includes operations as follows.

In a process of writing first data into a to-be-tested storage unit, a word line coupled to the to-be-tested storage unit is gated, a plurality of bit lines connected to the word line are gated synchronously, and the first data is written into a plurality of storage units coupled to the plurality of bit lines and the word line synchronously.

In a process of writing the second data into the to-be-tested storage unit, the second data is written into the plurality of storage units coupled to the plurality of bit lines and the word line synchronously.

In the embodiments of the disclosure, a plurality of bit lines may be synchronously gated during testing. In this way, a plurality of storage units on one same word line can be tested.

For example, a word line coupled to a to-be-tested storage unit is gated, eight adjacent bit lines are synchronously gated, and the first data is written. In this way, 8-bit data can be written once, and then the second data is written into these storage units, to implement the update of the 8-bit data.

Certainly, a plurality of bit lines may be synchronously gated during reading, to simultaneously read data in the plurality of storage units. For example, after 8-bit second data is written, data in eight storage units are read, and whether the read data is consistent with the written second data is tested. If data read from a storage unit is inconsistent with the second data, it indicates that the storage unit has an abnormality.

In this way, fast writing and testing can be performed, thereby reducing testing time, and improving testing efficiency.

In some embodiments, each of a plurality of storage blocks of the memory includes a to-be-tested storage unit. The operation that the word line coupled to the to-be-tested storage unit is gated includes an operation as follows.

Word lines coupled to the to-be-tested storage units in the plurality of storage blocks are gated synchronously.

In the embodiments of the disclosure, the plurality of storage blocks in the memory can be synchronously tested. For example, word lines in the plurality of storage blocks are synchronously gated for testing.

In some embodiments, during testing all storage units in one memory, word lines in a plurality of (for example, n) storage blocks may be synchronously gated, and a plurality of (for example, m) bit lines in each storage block are synchronously gated. In this way, n×m storage units can be synchronously tested, thereby greatly improving the testing efficiency.

Figure 2:
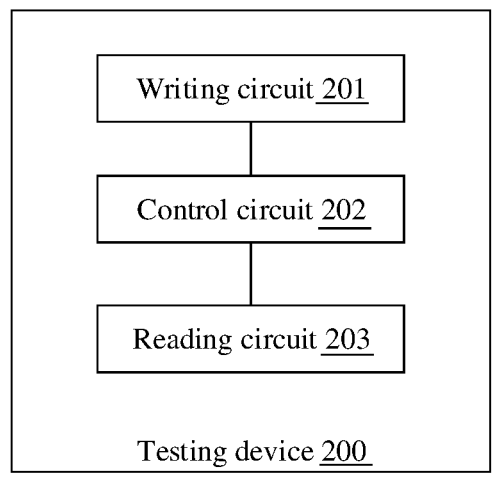
FIG. 2 is a structural block diagram of a device for testing a memory according to an embodiment of the disclosure.

As shown in FIG. 2, the embodiments of the disclosure further provide a device 200 for testing a memory, including a writing circuit 201, a control circuit 202 and a reading circuit 203.

The writing circuit 201 is configured to write data into a to-be-tested storage unit through an SA.

The control circuit 202 is configured to control an amplification duration of the SA.

The reading circuit 203 is configured to: read data stored in the storage unit, and determine, according to the read data, whether the storage unit is abnormal.

The writing circuit, the control circuit, and the reading circuit may be arranged in a testing device independent of the memory, may be connected to a peripheral circuit of the memory, and provide various signals to implement read/write control of the memory, to test the memory.

In another embodiment, the testing device may be arranged in the memory, and is directly connected to the storage unit by a peripheral circuit.

In practice, the testing device may be arranged in any host system that can be connected to and control the memory.

In some embodiments, the control circuit includes a timing control circuit configured to shorten the amplification duration of the SA.

In some embodiments, the timing control circuit includes a delay circuit configured to delay turning-on of an amplification function of the SA.

In some embodiments, the timing control circuit includes a turning-off circuit configured to advance turning-off of an amplification function of the SA.

The foregoing circuits may be separate circuits in hardware, or the same hardware circuit with different functions. During actual application, the foregoing circuits may be divided or combined, and are not limited herein.

Figure 3:
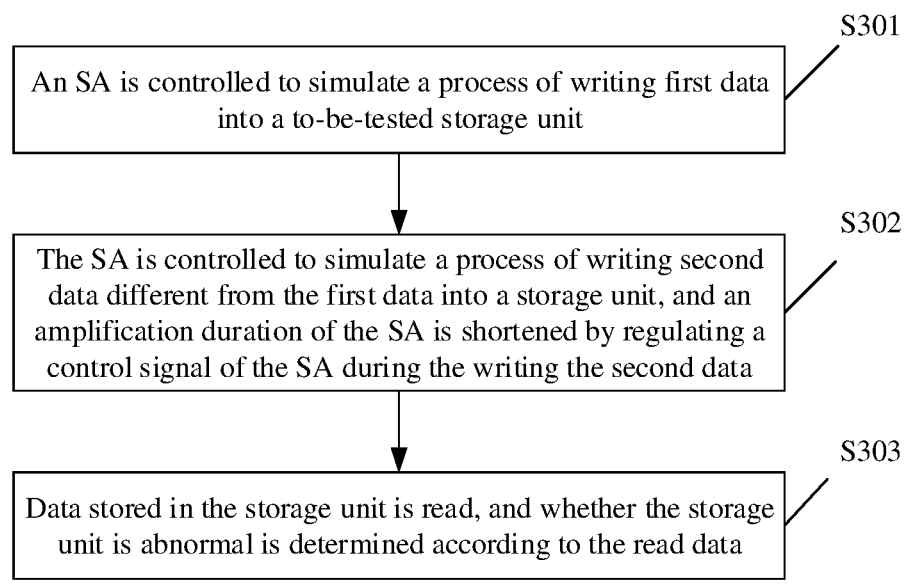
FIG. 3 is a second flowchart of a method for testing a memory according to an embodiment of the disclosure.

As shown in FIG. 3, the embodiments of the disclosure further provide a method for simulated testing. The method includes the following operations.

In S301, an SA is controlled to simulate a process of writing first data into a to-be-tested storage unit.

In S302, the SA is controlled to simulate a process of writing second data different from the first data into the storage unit, and an amplification duration of the SA is shortened by regulating a control signal of the SA during the writing of the second data.

In S303, data stored in the storage unit is read, and whether the storage unit is abnormal is determined based on the read data.

In the embodiments of the disclosure, simulated testing may be performed on a read/write abnormality of the storage unit by using software. The method for simulated testing may be applied to an actual memory product or may be used to perform virtual testing on an analog memory. For example, circuit parameters of a to-be-tested memory and a to-be-tested storage unit in design may be simulated using software, then the first data is written by using an analog signal, and the second data is written based on the SA with a shortened amplification duration. In this way, the analog signal may be used to test abnormalities such as electric leakage or excessively high impedance due to design defects in data reading and a contact structure of a storage unit, to facilitate detection of abnormalities in the product design.

During the foregoing simulated testing, the amplification duration of the SA may be shortened by using software. For example, a signal waveform of the SA is regulated by using software, and a process of writing data is simulated based on simulated memory and storage unit circuits, thereby simulating the case of shortening the amplification duration of the SA in a writing process.

In this way, in one aspect, with a method of a simulated circuit and an analog signal, design defects can be conveniently and quickly located, thereby reducing the testing cost and the development cost of products. In another aspect, in a process of simulated testing, the amplification duration of the SA may be regulated multiple times as required, an appropriate amplification duration within which predetermined abnormalities can be detected is found, and the amplification duration obtained through simulated testing is applied to online testing of products.

In some embodiments, the operation that the amplification duration of the SA is shortened by adjusting a control signal of the SA during the writing of the second data includes an operation as follows.

The amplification duration of the SA is shortened by providing a control signal for delaying turning-on after a bit line coupled to the storage unit is gated.

In some embodiments, the operation that the amplification duration of the SA is shortened by adjusting a control signal of the SA during the writing of the second data includes an operation as follows.

The amplification duration of the SA is shortened by providing a control signal for advancing turning-off after a bit line coupled to the storage unit is gated.

The foregoing method for controlling the amplification duration of the SA may include two cases of the control signal for delaying turning-on and the control signal for advancing turning-off.

In addition, in other embodiments, a periodic signal having a duty cycle may be provided as a control signal, to repeatedly switch the amplification function of the SA between an on state and an off state. In this way, the amplification duration of the SA can be regulated by regulating the duty cycle of the control signal.

Embodiments of the disclosure further provide the following examples.

A large number of product tests are required in a development and production process of DRAMs to discover product defects and facilitate improvement.

In the embodiments of the disclosure, a "Y-Page" manner may be used to perform a write operation and a read operation on a DRAM storage array to implement testing. In the "Y-Page" read/write manner, a plurality of bit lines are simultaneously gated in one write operation or read operation, and after one word line is selected, the word line may remain in an on state until the write operation or read operation is completely performed on the word line.

In addition, a plurality of storage blocks may be simultaneously tested in a compressed manner. That is, word lines in a plurality of storage blocks are simultaneously gated, and the foregoing "Y-Page" manner may be used to perform a read/write operation. In this way, a testing time can be significantly reduced, thereby reducing the development costs.

Figure 4:
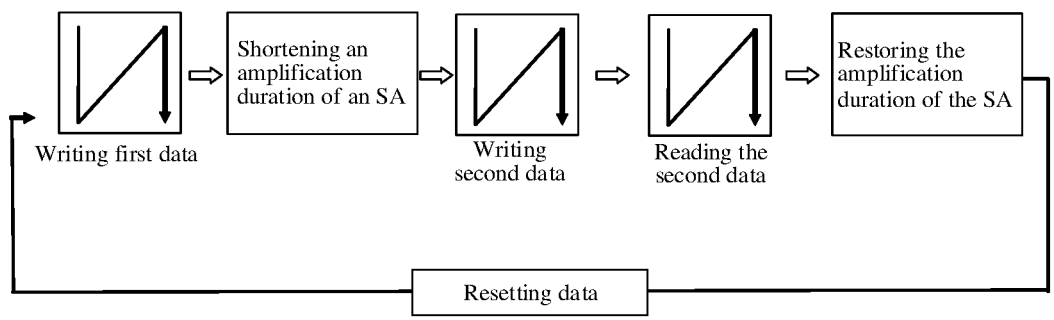
FIG. 4 is a schematic principle diagram of a method for testing a memory according to an embodiment of the disclosure.

As shown in FIG. 4, in the embodiments of the disclosure, the foregoing "Y-Page" method is used (and the foregoing compressed mode may be combined) to write first data "1" into to-be-tested storage units. In this way, it can be ensured that no unknown data is present in all of the to-be-tested storage units. An amplification duration of an SA is regulated, and second data "0" is written into the storage units another time within the shortened amplification duration of the SA. Finally, the "Y-Page" manner is used to read the data in the storage units, and it is determined based on reading results whether the storage units have abnormalities.

After the reading, the normal turning-on of the amplification function of the SA may be restored, to facilitate subsequent further operations.

Finally, the data may be reset to perform the foregoing testing again. For example, the first data "0" is written into the to-be-tested storage units, and then the second data "1" is written into the storage units within the shortened amplification duration of the SA. In this way, testing results may be further improved, to reduce a rate of missing detection.

Figure 5A:
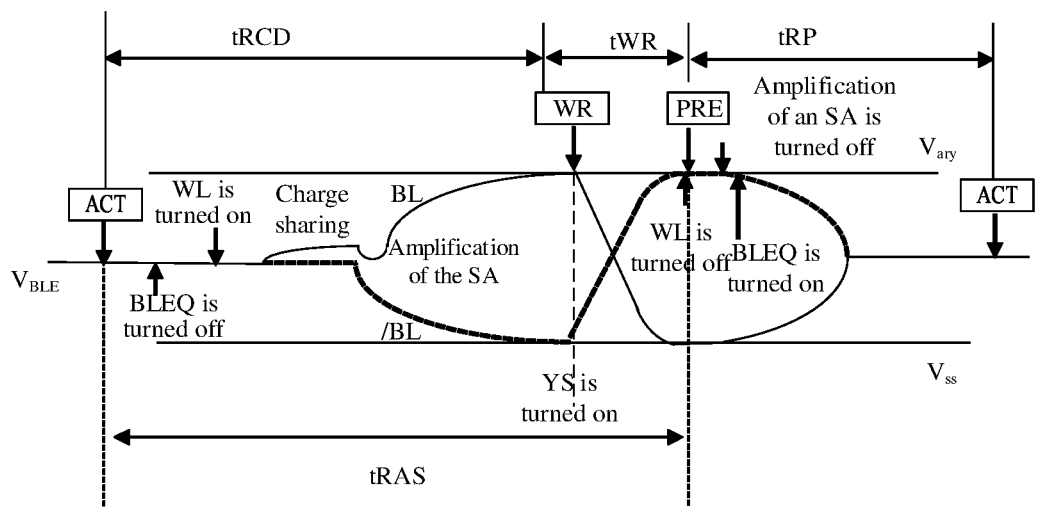
FIG. 5A is a timing diagram of writing second data into a storage unit in a method for testing a memory according to an embodiment of the disclosure.
Figure 5B:
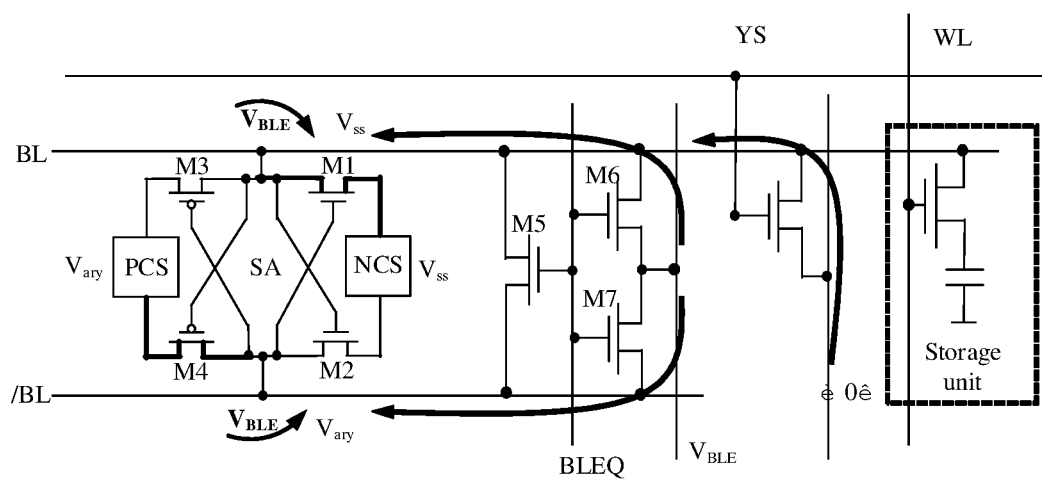
FIG. 5B is a principle diagram of writing based on a circuit structure in a method for testing a memory according to an embodiment of the disclosure.

The writing of the second data "0" is taken as an example. A signal timing in the bit line BL and the complementary bit line /BL is shown in FIG. 5A. FIG. 5B is a principle diagram of writing on the circuit structure. The writing of the second data "0" includes the following processes.

In a first process, in response to an active instruction ACT, Bit Line Equalization (BLEQ) is turned off (BLEQ off). After the BLEQ is turned off, the bit line BL and the complementary bit line /BL are not constrained by an equalization voltage $V_{BLE}$, and is affected by a storage unit and a write signal.

In a second process, a word line is turned on (WLon), and charges are shared between a storage unit and the BL, which makes a voltage of the BL rise to $V_{BLE}+\Delta V$, so that there is a voltage difference $\Delta V$ between the BL and the /BL.

In a third process, N-channel Metal-Oxide-Semiconductors (NMOS) devices M1 and M2 in Metal-Oxide-Semiconductors (MOS) field-effect transistors of an SA are turned on. However, M2 is turned on at a degree greater than that of M1. Therefore, the potential on /BL is pulled down to $V_{ss}$. Because M1 is temporarily turned on, the voltage of the BL is temporarily pulled down, and as a result M1 is turned off again.

In a fourth process, the voltage of /BL is $V_{ss}$. As a result, a potential on a control electrode of a PMOS device M3 is $V_{ss}$, and the PMOS device is turned on, to further pull down the voltage on the BL down to $V_{ary}$.

In a fifth process, A YS is turned on to transfer an externally inputted signal (that is, a voltage corresponding to inputted second data "0") to the BL, and the potential on the BL is quickly pulled down, and the potential on the /BL is pulled up. After the YS is turned off, a PMOS device M4 is turned on, the NMOS device M1 is turned on, and M3 and M2 are turned off. In this case, the potential on the /BL is pulled up to $V_{ary}$ again, and the potential on the BL is pulled down to $V_{ss}$, to enable a storage unit to store charges of the corresponding second data "0".

In a sixth process, after the second data "0" is stored, the WL is turned off, the amplification function of the SA is turned off, the BLEQ inputs a signal for turning on the NMOS, and NMOS devices M5, M6 and M7 are turned on, so that the voltages of the BL and the /BL are pulled to $V_{BLE}$, until the entire circuit is accessed a next time.

In addition, the timing in FIG. 5A includes several key timings of a write operation on the storage unit, including: DRAM RAS to CAS Delay (tRCD), DRAM Write Recovery Time (tWR), DRAM RAS Precharge Time (tRP) and DRAM Active to Precharge Delay (tRAS).

In tRCD, a RAS signal is a row address strobe, a CAS signal is a column address strobe. The tRCD defines a time required for the memory to perform a row address operation in a rank of the memory after a row address active (ACT) command is sent. Each storage unit is an address at which data can be stored. Each address has a row number and column number. Each row includes 1024 column addresses. After a row address is activated, a plurality of CAS requests are sent to perform read/write operations. That is, a position of a row address is known, and column addresses are found in the row to complete addressing, to perform a read/write operation. A period of time that elapses from a time of knowing the row address to a time of obtaining the column addresses is tRCD. When a row address in the memory is activated, the row address may be referred to as "open page". Eight row addresses may be opened simultaneously in a same rank (eight ranks, that is, one for each of eight granules). In FIG. 5A, an interval time from a time of sending a row address activation command ACT to a time of finding column addresses and sending a write instruction is tRCD.

The tWR is used for defining an interval time from a time (a time of starting writing) of sending a write command (a WR command in FIG. 5A) to a time of subsequent pre-charging in the memory, that is, a previous operation of tRP. If the time is set too short, the subsequent pre-charging may start before the writing is completed, and addressing is performed. As a result, written data is incomplete, which causes data loss. In the embodiments of the disclosure, a signal waveform of a power supply node of the SA may be regulated within a period of time corresponding to tWR shown in FIG. 5A to shorten the amplification duration of the amplification function of the SA.

After a previous row address operation is completed, and a row address deactivation command (a WL deactivation command shown in FIG. 5A) is sent, and a pre-charging command (a RPE command shown in FIG. 5A) is sent, an operation is to be performed on a next row address in the same bank, and tRP defines a pre-charging time before a next row address activation signal is sent. Before the row address deactivation command is sent, a plurality of row addresses in the rank may be read or written. Therefore, the impact of tRP on the memory performance is less than that of tRCD on the memory performance. The impact of tRP increases as activation and deactivation signals of a plurality of row addresses frequently operate on one bank, and expansion of tRP may help to improve the stability.

The tRAS is generally a sum of the tRCD and the tWR. If a duration of tRAS is excessively long, the performance of the system may degrade due to an excessively long wait time. If tRAS is excessively short, an activated row address enters an inactive state sooner, to cause data loss or damage.

The case of writing the second data "1" is similar to that of writing the second data "0". Details are not described again.

In the foregoing third and fourth processes, the MOS devices of the SA are turned on, to implement signal amplification. In the embodiments of the disclosure, a period of time of supplying a power supply voltage on the power supply node (including a PCS node and an NCS node) may be regulated to implement flexible regulation of the SA. For example, the period of time of supplying the power supply voltage is shortened to shorten a period of time for which the SA actually implements signal amplification. In this way, a period of time of storing charges in the storage unit may be reduced, and the difficulty of writing the second data is increased, so that an abnormality of the storage unit can be detected more easily.

Figure 6A:
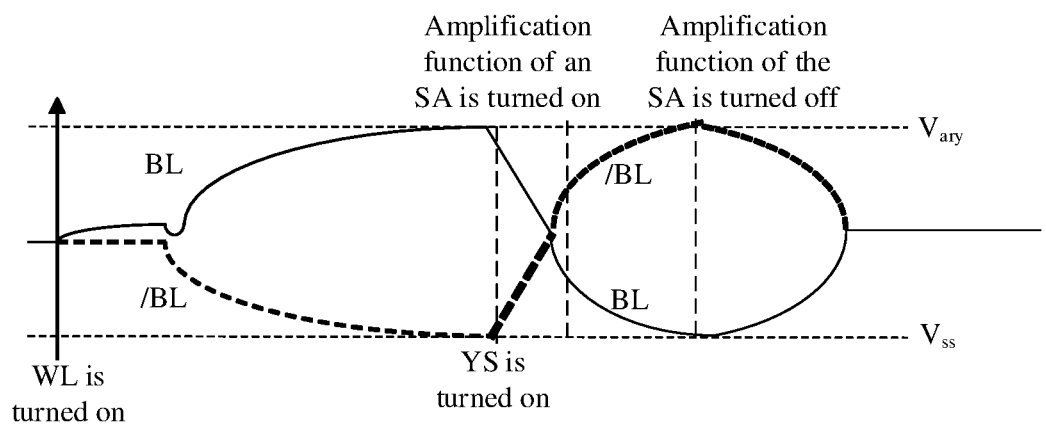
FIG. 6A is a signal timing diagram of writing second data "0" into a storage unit and normally turning an SA on in a method for testing a memory according to an embodiment of the disclosure.

In a case that the written second data is "0", if the amplification duration of the SA is not shortened, a waveform timing of the bit line BL and the complementary bit line /BL of the SA are shown in FIG. 6A. After a bit line gate signal YS is enabled, the voltages on the bit line BL and the complementary bit line /BL are quickly flipped. In this way, a storage unit is normally charged to store corresponding data. Even if the contact structure of the storage unit has a defect, for example, the impedance of the BLC between the storage unit and the bit line is excessively high, correct data may be written within a sufficiently long charging time, and it is difficult to detect the detect of the storage unit.

Figure 6B:
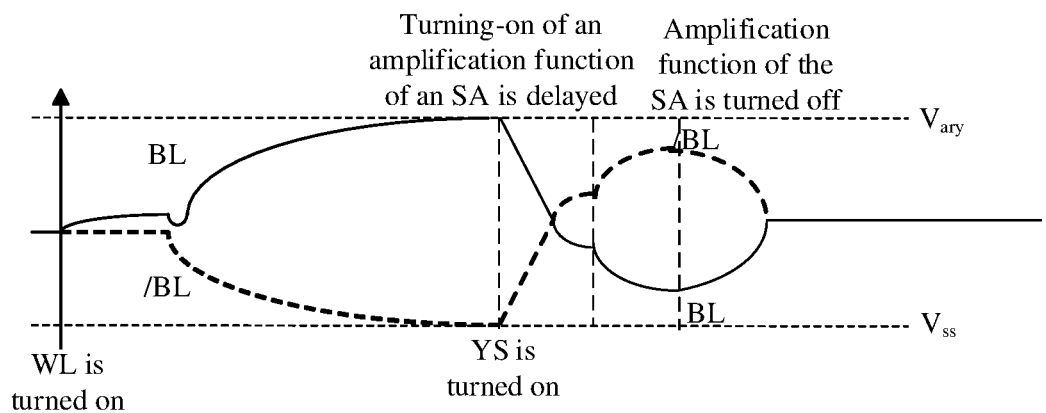
FIG. 6B is a signal timing diagram of writing second data "0" into a storage unit and turning on an amplification function of an SA with a delay in a method for testing a memory according to an embodiment of the disclosure.

During the writing of the second data "0", the turning on of the amplification function of the SA is delayed, and a waveform timing diagram of the bit line BL and the complementary bit line /BL is shown in FIG. 6B. After the bit line gate signal YS is enabled, voltages on the bit line BL and the complementary bit line /BL cannot be quickly flipped. After the amplification function of the SA is turned on, the voltages on the bit line BL and the complementary bit line /BL are amplified. However, when the amplification function of the SA is normally turned off, the bit line BL and the complementary bit line /BL have insufficient voltages. As a result, a voltage and a period of time for storing data into the storage unit are insufficient. Therefore, it is difficult to store correct data, and thus easy to detect an abnormality of the storage unit.

Figure 6C:
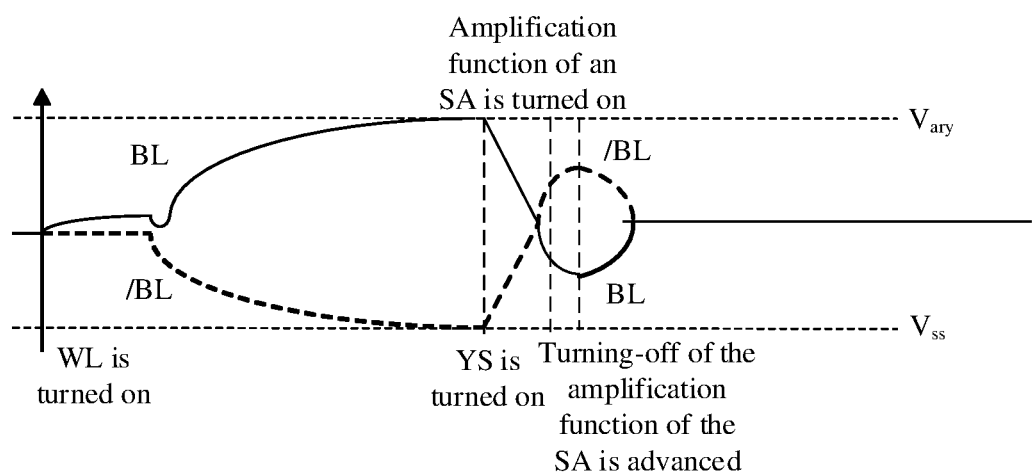
FIG. 6C is a signal timing diagram of writing second data "0" into a storage unit and turning off an amplification function of an SA in advance in a method for testing a memory according to an embodiment of the disclosure.

Correspondingly, as shown in FIG. 6C, after the bit line gate signal YS is enabled, voltages on the bit line BL and the complementary bit line /BL are quickly flipped, and the voltages are amplified after the amplification function of the SA is turned on. However, because the amplification function of the SA is turned off in advance, the voltages on the bit line BL and the complementary bit line /BL fail to reach desired voltages and return to the same voltage in advance. As a result, the voltage and the period of time for storing data into the storage unit are insufficient. Therefore, it is difficult to store correct data, and thus easy to detect an abnormality of the storage unit.

Figure 6D:
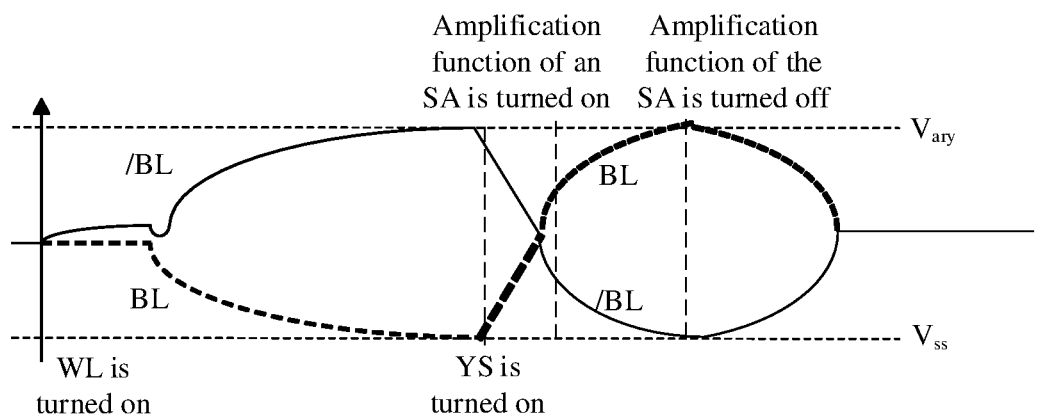
FIG. 6D is a signal timing diagram of writing second data "1" into a storage unit and normally turning on an amplification function of an SA in a method for testing a memory according to an embodiment of the disclosure.
Figure 6E:
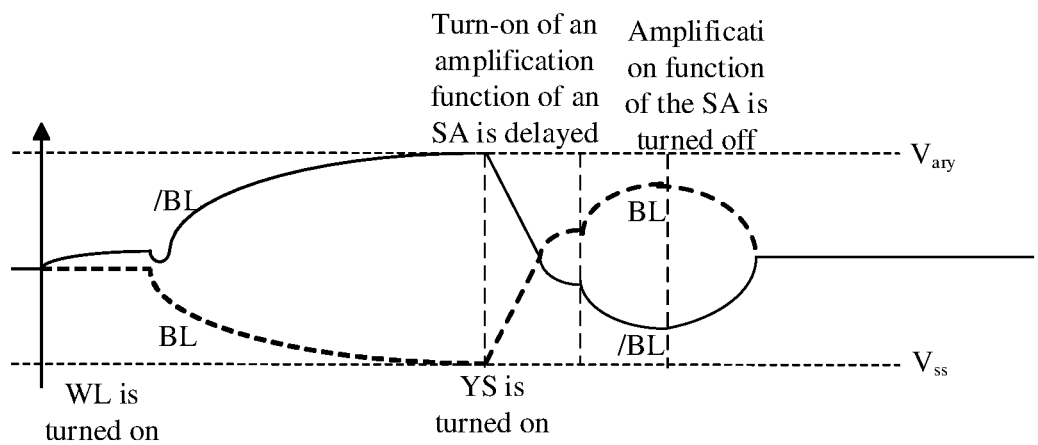
FIG. 6E is a signal timing diagram of writing second data "1" into a storage unit and turning on an amplification function of an SA with a delay in a method for testing a memory according to an embodiment of the disclosure.
Figure 6F:
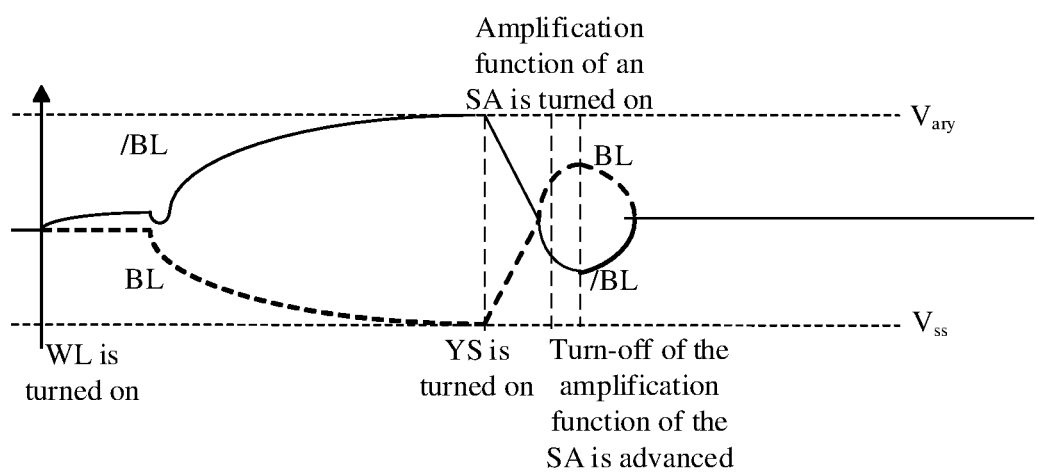
FIG. 6F is a signal timing diagram of writing second data "I" into a storage unit and turning off an amplification function of an SA in advance in a method for testing a memory according to an embodiment of the disclosure.

During the writing of the second data "1", if the amplification duration of the SA is not shortened, a waveform timings of the bit line BL and the complementary bit line /BL of the SA is shown in FIG. 6D. If the amplification function of the SA is turned on with a delay, a waveform timing is shown in FIG. 6E. If the amplification function of the SA is turned off in advance, a waveform timing is shown in FIG. 6F.

The foregoing FIG. 6A to FIG. 6F are only used for exemplarily describing insufficient potential for writing data into the storage unit caused by delaying the turning-on of the amplification function of the SA or advancing the turning-off of the amplification function for different write data, but do not represent actual durations, proportions, and the like of waveforms.

It should be understood that the words "one embodiment" or "an embodiment" throughout the specification means that particular features, structures or characteristics associated with the embodiment are included in at least one embodiment of the disclosure. Therefore, the words "in one embodiment" or "in an embodiment" appearing throughout the specification do not necessarily refer to the same embodiment. In addition, these particular features, structures or characteristics may be combined in any appropriate manner in one or more embodiments. It should be understood that in the various embodiments of the disclosure, the sequence numbers of the above processes do not imply an execution order, and the order of executing the processes shall be determined by functions and intrinsic logic of the processes, and shall not constitute any limitation to the processes implemented in the embodiments of the disclosure. The foregoing sequence numbers in the embodiments of the disclosure are merely for the convenience of description, and do not imply the preference among the embodiments.

It should be noted that the terms "include", "comprise" or any variation thereof herein are intended to cover a non-exclusive inclusion. Therefore, a process, method, object or device including a series of elements not only includes the elements, but also includes other elements not specified expressly, or may include inherent elements of the process, method, object or device. If no more limitations are made, an element limited by "include a/an . . . " does not exclude other same elements existing in the process, the method, the object or the device including the element.

In the multiple embodiments provided in the disclosure, it should be understood that the disclosed device and method may be implemented in other forms. The described device embodiment is merely an example. For example, division for the units is merely logical function division and may be other division in actual implementation. For example, a plurality of units or components may be combined or integrated into another system, or some features may be ignored or not performed. In addition, the coupling or direct coupling or communication connection between the shown or discussed components may be indirect coupling or communication connection through some interfaces, devices or units, or may be electrical, mechanical or connections in other forms.

The units described as separate parts may or may not be physically separate, and parts shown as units may or may not be physical units, that is, may be arranged in one position, or may be distributed on a plurality of network units. Some or all of the units may be selected according to actual needs to achieve the objects of the solutions in the embodiments.

In addition, functional units in the embodiments of the disclosure may all be integrated into one processing unit, or each of the units may exist alone, or two or more units are integrated into one unit. The integrated unit may be implemented in the form of hardware or a software functional unit in addition to hardware.

The foregoing descriptions are merely implementations of the disclosure, but are not intended to limit the protection scope of the disclosure. Any variation or substitution that may be readily figured out by a person skilled in the art within the technical scope disclosed in the disclosure shall fall within the protection scope of the disclosure. Therefore, the protection scope of the disclosure shall be subject to the protection scope of the claims.

INDUSTRIAL APPLICABILITY

In the technical solution in the embodiments of the disclosure, first data is first written into a storage unit, and then second data different from the first data is written. In addition, an amplification duration of an SA is shortened during the writing of the second data. In this way, in one aspect, the shortening of the amplification duration of the SA increases the writing difficulty, which makes it more difficult to write correct data into an abnormal storage unit. In another aspect, if the second data is failed to be written, data stored in the storage unit is only the first data, and the abnormal storage unit can be detected more easily, thereby improving the testing accuracy.

What is claimed is:

1. A method for testing a memory, comprising:
writing, through a Sense Amplifier (SA), first data into a to-be-tested storage unit;
writing, through the SA, second data into the storage unit, the second data being different from the first data, and shortening an amplification duration of the SA during writing the second data; and
reading data stored in the storage unit, and determining, according to the read data, whether the storage unit is abnormal.

2. The method according to claim 1, wherein the shortening the amplification duration of the SA during writing the second data comprises:
gating a bit line coupled to the storage unit to transfer a write voltage to be written to the bit line; and
turning on an amplification function of the SA with a delay of a first predetermined duration after the bit line is gated, wherein the second data is written into the storage unit based on the write voltage after the amplification function of the SA is turned on.

3. The method according to claim 2, wherein the SA comprises a power supply node, and the turning on the amplification function of the SA with a delay of the first predetermined duration after the bit line is gated comprises:
applying a turn-on voltage to the power supply node with a delay of the first duration after the bit line is gated, to turn-on the amplification function of the SA.

4. The method according to claim 1, wherein the shortening the amplification duration of the SA during writing the second data comprises:
gating a bit line coupled to the storage unit to transfer a write voltage to be written to the bit line; and
turning off an amplification function of the SA a second predetermined duration in advance after the bit line is gated, wherein the second data is written into the storage unit based on the write voltage after the amplification function of the SA is turned on.

5. The method according to claim 4, wherein the SA comprises a power supply node, and the turning off the amplification function of the SA the second predetermined duration in advance after the bit line is gated comprises:
applying a turn-off voltage to the power supply node the second predetermined duration in advance after the bit line is gated, to turn off the amplification function of the SA.

6. The method according to claim 2, wherein a first write duration for writing the first data is equal to a second write duration for writing the second data; and
a first amplification duration of the SA during the writing the first data is greater than a second amplification duration of the SA during the writing the second data.

7. The method according to claim 3, wherein a first write duration for writing the first data is equal to a second write duration for writing the second data; and
a first amplification duration of the SA during the writing the first data is greater than a second amplification duration of the SA during the writing the second data.

8. The method according to claim 4, wherein a first write duration for writing the first data is equal to a second write duration for writing the second data; and
a first amplification duration of the SA during the writing the first data is greater than a second amplification duration of the SA during the writing the second data.

9. The method according to claim 5, wherein a first write duration for writing the first data is equal to a second write duration for writing the second data; and
a first amplification duration of the SA during the writing the first data is greater than a second amplification duration of the SA during the writing the second data.

10. The method according to claim 6, wherein the gating the bit line coupled to the storage unit to transfer the write voltage to be written to the bit line comprises:
gating the bit line coupled to the storage unit within the second write duration, to transfer the write voltage to be written to the bit line, wherein the second write duration is greater than the second amplification duration of the SA.

11. The method according to claim 7, wherein the gating the bit line coupled to the storage unit to transfer the write voltage to be written to the bit line comprises:
gating the bit line coupled to the storage unit within the second write duration, to transfer the write voltage to be written to the bit line, wherein the second write duration is greater than the second amplification duration of the SA.

12. The method according to claim 1, wherein the memory comprises at least one storage block, and the storage block comprises a plurality of storage units, and the method further comprises:
during the writing first data into the to-be-tested storage unit, gating a word line coupled to the to-be-tested storage unit, synchronously gating a plurality of bit lines connected to the word line, and synchronously writing the first data into a plurality of storage units coupled to the plurality of bit lines and the word line; and during the writing the second data into the to-be-tested storage unit, synchronously writing the second data into the plurality of storage units coupled to the plurality of bit lines and the word line.

13. The method according to claim 12, wherein each of a plurality of storage blocks in the memory comprises a to-be-tested storage unit, and the gating the word line coupled to the to-be-tested storage unit comprises:

synchronously gating word lines coupled to the to-be-tested storage units in the plurality of storage blocks.

14. A device for testing a memory, comprising:
a writing circuit configured to write data into a to-be-tested storage unit through a Sense Amplifier (SA);
a control circuit configured to control an amplification duration of the SA; and
a reading circuit configured to read data stored in the storage unit, and determine, according to the read data, whether the storage unit is abnormal.

15. The device according to claim 14, wherein the control circuit comprises:
a timing control circuit configured to shorten the amplification duration of the SA.

16. The device according to claim 15, wherein the timing control circuit comprises:
a delay circuit configured to delay turning-on of an amplification function of the SA.

17. The device according to claim 15, wherein the timing control circuit comprises:
a turning-off circuit configured to advance turning-off of an amplification function of the SA.

18. A method for simulated testing, comprising:
simulating, by controlling a Sense Amplifier (SA), a process of writing first data into a to-be-tested storage unit;
simulating, by the SA, a process of writing second data different from the first data into the storage unit, and shortening an amplification duration of the SA by regulating a control signal of the SA during the writing the second data; and
reading data stored in the storage unit, and determining, according to the read data, whether the storage unit is abnormal.

19. The method according to claim 18, wherein the shortening the amplification duration of the SA by regulating the control signal of the SA during the writing the second data comprises:
shortening the amplification duration of the SA by providing a control signal for delaying turning-on after a bit line coupled to the storage unit is gated.

20. The method according to claim 18, wherein the shortening the amplification duration of the SA by regulating the control signal of the SA during the writing the second data comprises:
shortening the amplification duration of the SA by providing a control signal for advancing turning-off after a bit line coupled to the storage unit is gated.

* * * * *